US012813152B2

(12) United States Patent
Kim et al.

(10) Patent No.: US 12,813,152 B2
(45) Date of Patent: Nov. 24, 2026

(54) DISPLAY DEVICE MANUFACTURING METHOD AND DISPLAY DEVICE

(71) Applicant: Samsung Display Co., Ltd., Yongin-si (KR)

(72) Inventors: Joonhyung Kim, Yongin-si (KR); Sukbong Lee, Yongin-si (KR); Seungil Jang, Yongin-si (KR); Jin Hyun Jun, Yongin-si (KR); Heekyun Shin, Yongin-si (KR); Kiseok Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 534 days.

(21) Appl. No.: 18/343,476

(22) Filed: Jun. 28, 2023

(65) Prior Publication Data

US 2024/0081137 A1 Mar. 7, 2024

(30) Foreign Application Priority Data

Aug. 26, 2022 (KR) ........................ 10-2022-0107386

(51) Int. Cl.

| | |
|---|---|
| ***H10K 71/40*** | (2023.01) |
| ***H10K 59/12*** | (2023.01) |
| ***H10K 59/80*** | (2023.01) |

(52) U.S. Cl.

CPC ......... *H10K 71/40* (2023.02); *H10K 59/1201* (2023.02); *H10K 59/873* (2023.02)

(58) Field of Classification Search

CPC .. H10K 71/40; H10K 59/1201; H10K 59/873; H10K 50/10; H10K 59/10; H10K 2102/361; H10K 71/80; H10K 59/12; H10K 59/80; H10K 71/421; H10K 71/00; H10K 50/844; H10K 59/131; H10K 77/111; H10K 2102/311; C08G 73/1039; C08G 73/1064; C08G 73/1067; C08G 73/1071; G09F 9/335

See application file for complete search history.

(56) References Cited

U.S. PATENT DOCUMENTS

| | | | |
|---|---|---|---|
| 10,005,263 | B2 | 6/2018 | Jung et al. |
| 2010/0035407 | A1 | 2/2010 | Goto et al. |

(Continued)

FOREIGN PATENT DOCUMENTS

| | | | |
|---|---|---|---|
| JP | 2019020509 | A | 2/2019 |
| JP | 2021105704 | A | 7/2021 |

(Continued)

OTHER PUBLICATIONS

European Notification of the Office Action for Patent Application No. 23191821.0, dated Dec. 19, 2024, 5 pages.

(Continued)

*Primary Examiner* — Kevin Quarterman

(74) *Attorney, Agent, or Firm* — Womble Bond Dickinson (US) LLP

(57) ABSTRACT

Provided is a display device manufacturing method including forming a display panel on a processing substrate by forming a base layer including a colorless polyimide layer, and a functional layer, and separating the display panel from the processing substrate by emitting laser having an intensity such that about 90% of a maximum intensity is about 6.0 MW/cm2 to about 6.8 MW/cm2.

18 Claims, 9 Drawing Sheets

(56) References Cited

U.S. PATENT DOCUMENTS

| | | | | |
|---|---|---|---|---|
| 2014/0320777 | A1* | 10/2014 | Fukushima | G02F 1/136277 257/59 |
| 2019/0019951 | A1 | 1/2019 | Nakagawa | |
| 2020/0031997 | A1 | 1/2020 | Ren et al. | |
| 2020/0083449 | A1 | 3/2020 | Kim et al. | |
| 2021/0202753 | A1 | 7/2021 | Matsueda et al. | |
| 2022/0115452 | A1* | 4/2022 | Hou | H10K 59/121 |
| 2022/0199920 | A1* | 6/2022 | Kim | H10K 59/352 |
| 2022/0223820 | A1* | 7/2022 | Kang | B29C 43/021 |
| 2023/0022035 | A1* | 1/2023 | Cha | H10K 59/126 |
| 2023/0108673 | A1* | 4/2023 | Zhang | H10K 77/10 257/40 |

FOREIGN PATENT DOCUMENTS

| | | | |
|---|---|---|---|
| KR | 10-1600913 | B1 | 3/2016 |
| KR | 10-1900283 | B1 | 11/2018 |
| KR | 10-2020-0030160 | A | 3/2020 |
| KR | 20200074538 | A | 6/2020 |
| KR | 10-2325514 | B1 | 11/2021 |

OTHER PUBLICATIONS

Hong-Jiang, N. et al., "A review on colorless and optically transparent polyimide films: Chemistry, process and engineering applications", Journal of Industrial and Engineering Chemistry, Mar. 26, 2015, pp. 16-27.

Kim et al. "Effects of Polyimide Curing on Image Sticking Behaviors of Flexible Displays," Scientific Reports, vol. 11, 2021, 8 pages.

Miwa et al. "Relationship Between Structure and Adhesion Properties of Aromatic Polyimides," Polymer, vol. 34 (No. 3), 1993, pp. 621-624.

Jou et al., "Adhesion of Polyimide to Silicon and Polyimide," Journal of Applied Polymer Science, Feb. 15, 1993, pp. 1219-1232, vol. 47, No. 7.

* cited by examiner

DISPLAY DEVICE MANUFACTURING METHOD AND DISPLAY DEVICE

CROSS-REFERENCE TO RELATED APPLICATIONS

This application claims priority to, and the benefit of, Korean Patent Application No. 10-2022-0107386, filed on Aug. 26, 2022, in the Korean Intellectual Property Office, the entire contents of which are hereby incorporated by reference.

BACKGROUND

1. Field

The present disclosure herein relates to a display device manufacturing method including separating a display panel from a substrate for processing, and a corresponding display device.

2. Description of Related Art

A display device may detect an externally applied input, and may display various images to provide information for a user. The display device may include a display panel for displaying an image, and various optical members or window members.

The display device is manufactured through a multi-stage process. A substrate for processing for supporting or protecting the display panel may be provided during the process. Thereafter, the display panel may be separated from the substrate for processing, and the various optical members or a window may be coupled to the display panel.

It is suitable to normally separate the display panel from the substrate for processing, and also to avoid separated of, or damage to, layers constituting the display panel. Thus, research for effectively separating the display panel from the substrate for processing is conducted.

SUMMARY

The present disclosure provides a display device manufacturing method for effectively separating a display panel including a colorless polyimide layer from a substrate for processing.

The present disclosure also provides a display device in which a display panel includes a colorless polyimide layer with improved transmittance and processability.

One or more embodiments of the present disclosure provide a display device manufacturing method including forming a display panel on a processing substrate by forming a base layer including a colorless polyimide layer, and a functional layer, and separating the display panel from the processing substrate by emitting laser having an intensity such that about 90% of a maximum intensity is about 6.0 $MW/cm^2$ to about 6.8 $MW/cm^2$.

The forming of the base layer may include forming the colorless polyimide layer by applying a colorless polyimide material, curing the colorless polyimide material at a curing temperature that is higher than about 430° C. and that is lower than or equal to about 470° C. for about 10 minutes to about 30 minutes, and cooling the colorless polyimide material with outside air, and forming the functional layer.

The curing may further include raising a temperature from about 180° C. to the curing temperature for about 4 minutes to about 6 minutes.

The colorless polyimide layer may include a fully aromatic polyimide including at least one of a trifluoromethyl group, an ether group, or a sulfonyl group.

The colorless polyimide layer may have a yellow index of about 7 or less, and a light transmittance of about 83% or greater in a visible wavelength region.

The functional layer may include a silicon oxide.

The colorless polyimide layer may include a first colorless polyimide layer and a second colorless polyimide layer, wherein the forming of the base layer includes forming the first colorless polyimide layer on the processing substrate, forming a first barrier layer on the first colorless polyimide layer, forming the second colorless polyimide layer on the first barrier layer, forming the functional layer on the second colorless polyimide layer, and forming a second barrier layer on the functional layer.

The forming of the functional layer may include forming the functional layer to a thickness of about 500 Å to about 5000 Å.

In the separating of the display panel, a minor axis of the laser may have a width of about 370 μm to about 400 μm and a steepness of about 30 μm to about 60 μm.

In the separating of the display panel, the laser may have a wavelength of about 300 nm to about 400 nm.

In the separating of the display panel, the laser may be emitted in a direction from the processing substrate toward the display panel.

The display device manufacturing method may further include forming, on the processing substrate, a sacrificial layer including amorphous silicon, wherein the forming of the display panel includes forming the display panel on the sacrificial layer.

The forming of the display panel may further include forming a circuit layer on the base layer, forming a light-emitting element layer on the circuit layer, and forming an encapsulation layer on the light-emitting element layer.

In one or more embodiments of the present disclosure, a display device manufacturing method includes forming a display panel on a processing substrate by forming a first colorless polyimide layer on the processing substrate, forming a first barrier layer on the first colorless polyimide layer, forming a second colorless polyimide layer on the first barrier layer, forming, on the second colorless polyimide layer, a functional layer including a silicon oxide, and forming a second barrier layer on the functional layer, and separating the display panel from the processing substrate by emitting laser, wherein the forming of the first colorless polyimide layer or the forming of the second colorless polyimide layer includes applying a colorless polyimide material, curing the colorless polyimide material at a curing temperature that is higher than about 430° C. and that is lower than or equal to about 470° C. for about 10 minutes to about 30 minutes, and cooling the colorless polyimide material with outside air.

The curing may further include raising a temperature from about 180° C. to the curing temperature for about 4 minutes to about 6 minutes.

In the separating of the display panel, the laser may have an intensity such that about 90% of a maximum intensity is about 6.0 $MW/cm^2$ to about 6.8 $MW/cm^2$.

The separating of the display panel may include emitting a laser beam having a wavelength of about 300 nm to about 400 nm.

The forming of the functional layer may include forming the functional layer to a thickness of about 500 Å to about 5000 Å.

In one or more embodiments of the present disclosure, a display device includes a base layer including a first colorless polyimide layer, a first barrier layer above the first colorless polyimide layer, a second colorless polyimide layer above the first barrier layer, a functional layer including a silicon oxide and above the second colorless polyimide layer, and a second barrier layer above the functional layer, a circuit layer above the base layer, a light-emitting element layer above the circuit layer, and an encapsulation layer above the light-emitting element layer.

The first colorless polyimide layer and the second colorless polyimide layer may include a fully aromatic polyimide including at least one of a trifluoromethyl group, an ether group, or a sulfonyl group.

The first colorless polyimide layer and the second colorless polyimide layer may include a polyimide having a decomposition temperature of about 524° C.

The first colorless polyimide layer and the second colorless polyimide layer may have adhesion of about 500 gf/in or greater.

The functional layer may have a thickness of about 500 Å to about 5000 Å.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
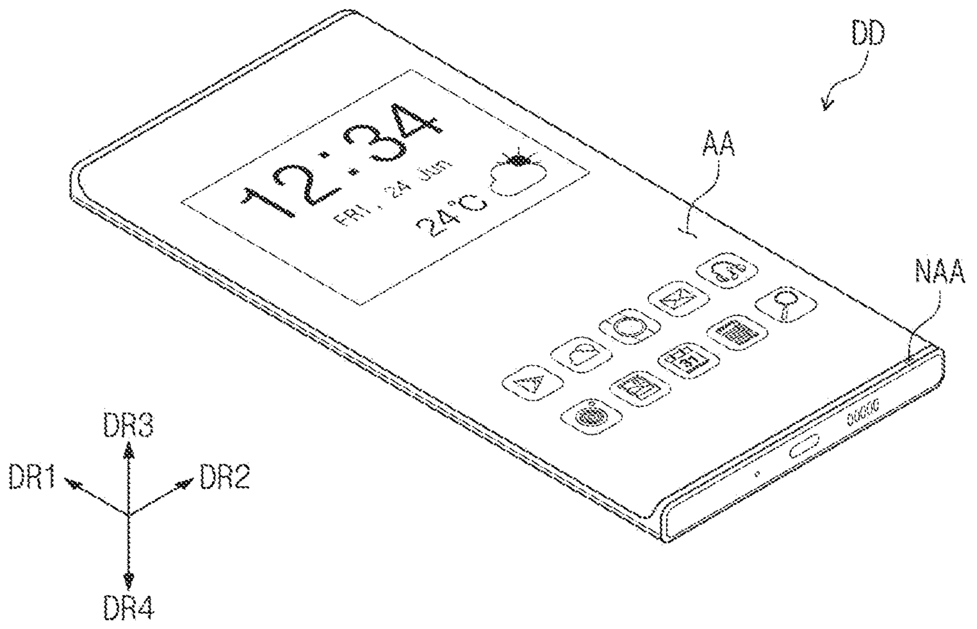
FIG. 1 is an assembled perspective view of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
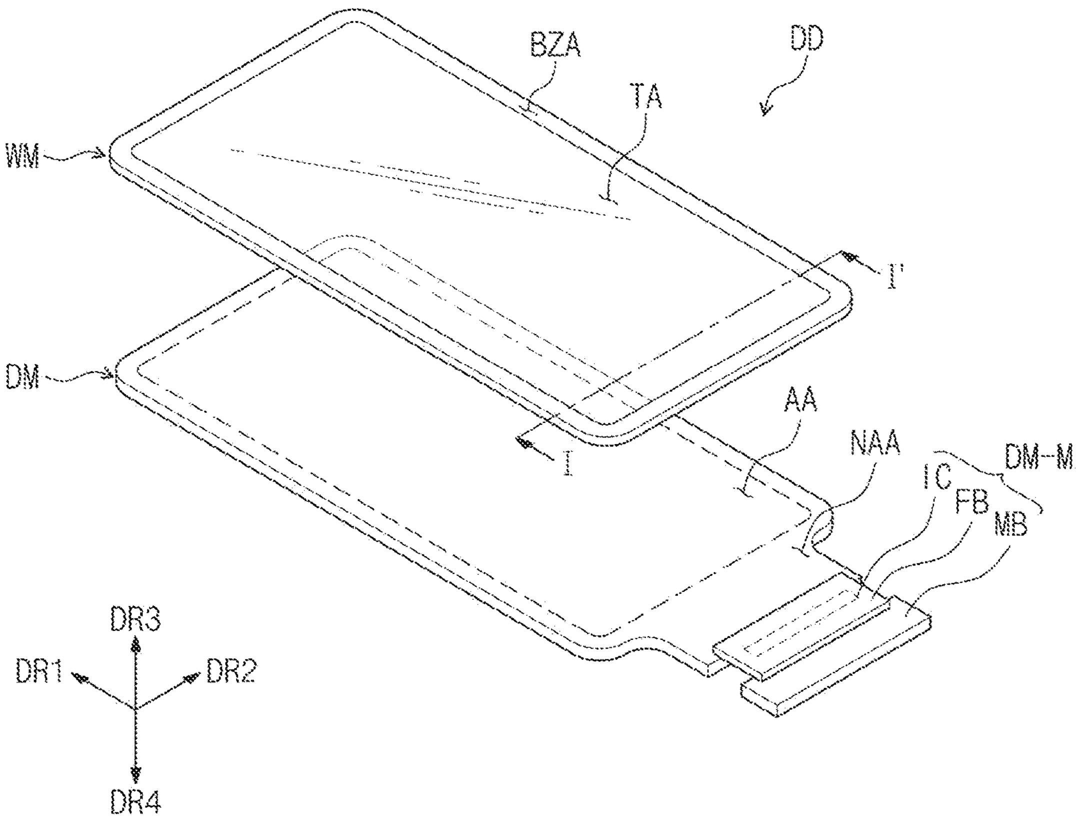
FIG. 2 is an exploded perspective view of a display device according to one or more embodiments of the present disclosure.
Figure 3:
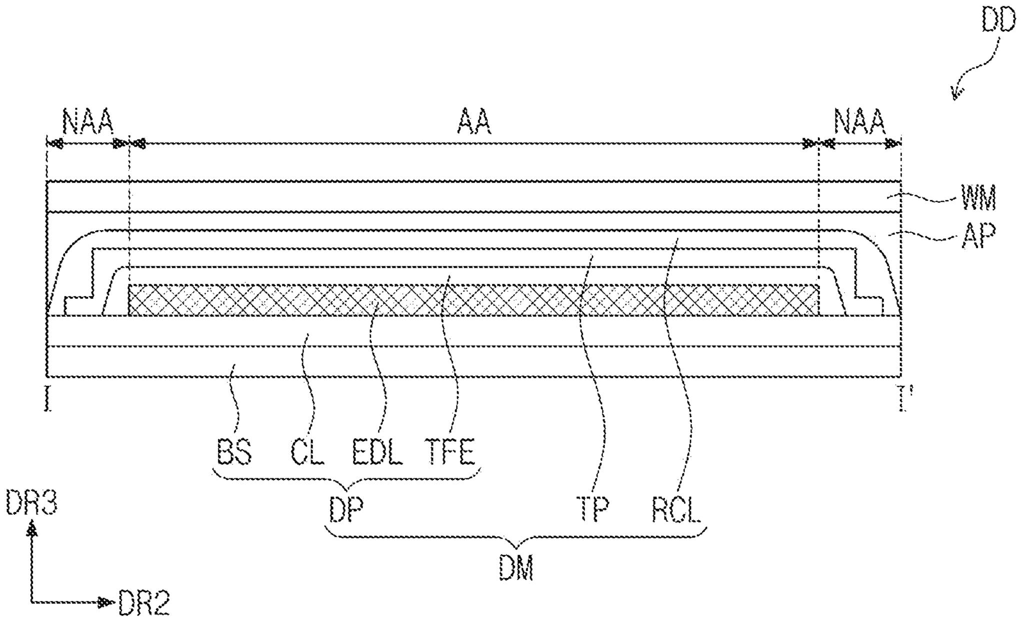
FIG. 3 is a cross-sectional view of a display device according to one or more embodiments of the present disclosure.

FIG. 1 is an assembled perspective view of a display device DD according to one or more embodiments of the present disclosure. FIG. 2 is an exploded perspective view of a display device DD according to one or more embodiments of the present disclosure. FIG. 3 is a cross-sectional view of a display device DD according to one or more embodiments of the present disclosure.

The display device DD according to one or more embodiments of the present disclosure illustrated in FIGS. 1 to 3 may be a device activated in response to an electrical signal. For example, the display device DD may be a mobile phone, a tablet computer, a monitor, a television, a vehicle navigation device, a game console or a wearable device, but one or more embodiments is not limited thereto. FIG. 1 illustrates a mobile phone as an example of the display device DD.

The display device DD according to one or more embodiments may display an image through an active region AA. The active region AA may include a plane defined by a first direction DR1 and a second direction DR2. The active region AA may further include a curved surface bent from at least one side of the plane defined by the first direction DR1 and the second direction DR2.

A peripheral region NAA is adjacent to the active region AA. The peripheral region NAA may surround the active region AA. Accordingly, the shape of the active region AA may be defined substantially by the peripheral region NAA. However, this is illustrated as an example, and the peripheral region NAA may be located adjacent to only one side of the active region AA, or may be omitted. The display device DD according to one or more embodiments of the present disclosure may include the active region AA having various shapes, and is not limited to any one embodiment.

FIG. 1 illustrate that the display device DD according to one or more embodiments includes two curved surfaces bent from two sides respectively of a plane defined by the first direction DR1 and the second direction DR2. However, the shape of the active region AA is not limited thereto. For example, the active region AA may include the plane alone, and the active region AA may further include at least two curved surfaces, for example, four curved surfaces bent from four respective sides of the plane.

In FIG. 1 and the following drawings, the first direction DR1 to a fourth direction DR4 are illustrated. Directions indicated by the first direction DR1 to the fourth direction DR4 used herein are relative concepts and may be changed to other directions.

In the present disclosure, the first direction DR1 and a second direction DR2 perpendicularly cross each other, and a third direction DR3 may be a normal direction to a plane defined by the first direction DR1 and the second direction DR2. The fourth direction DR4 may be a normal direction to a plane defined by the first direction DR1 and the second direction DR2, and may indicate a direction opposite to the third direction DR3.

A thickness direction of the display device DD may be a direction parallel to the third direction DR3 that is a normal direction to a plane defined by the first direction DR1 and the second direction DR2. In the present disclosure, a front surface (or top surface) and a rear surface (or bottom surface) of each of members, which constitute the display device DD, may be defined based on the third direction DR3.

In the present disclosure, "on a plane" may mean being seen on a plane defined by the first direction DR1 and the second direction DR2. In the present disclosure, "overlapping" may mean overlapping on a plane unless a specific definition is otherwise provided.

The display device DD according to one or more embodiments may include a display module DM. The display module DM may be a component that generates an image, and that detects an input applied from the outside. The display module DM according to one or more embodiments includes a display panel DP. The display module DM according to one or more embodiments may further include a sensor layer TP located on the display panel DP, and an optical layer RCL located on the sensor layer TP. However, one or more embodiments is not limited thereto, and the sensor layer TP or the optical layer RCL may be omitted in one or more embodiments.

The active region AA and the peripheral region NAA may be defined in the display module DM. The active region AA may be a region activated in response to an electrical signal. The peripheral region NAA may be a region located adjacent to at least one side of the active region AA.

The peripheral region NAA may surround the active region AA. However, one or more embodiments is not limited thereto, and a portion of the peripheral region NAA may be omitted unlike that illustrated in FIG. 2, etc. A driving circuit, a driving wire, or the like, for driving the active region AA may be located in the peripheral region NAA.

In one or more embodiments, the display panel DP may be a component that substantially generates an image. The display panel DP may be a light-emitting display panel. For example, the display panel DP may be an organic light-emitting display panel, an inorganic light-emitting display panel, a quantum dot display panel, a micro-LED display panel, or a nano-LED display panel. Hereinafter, the display panel DP according to one or more embodiments is described as the organic light-emitting display panel.

FIG. 3 may be a cross-sectional view taken along the line I-I' in FIG. 2 of the present disclosure. Referring to FIG. 3, the display panel DP may include a base layer BS, a circuit layer CL, a light-emitting element layer EDL, and an encapsulation layer TFE.

The base layer BS may be a member that provides a base surface on which the circuit layer CL is located. The base layer BS may be a rigid substrate, or a flexible substrate that is bendable, foldable, rollable, or the like. The base layer BS may be a glass substrate, a metal substrate, a polymer substrate, or the like. However, one or more embodiments of the present disclosure is not limited thereto, and the base layer BS may be an inorganic layer, an organic layer, or a composite material layer.

The circuit layer CL may be located on the base layer BS. The circuit layer CL may include an insulation layer, a semiconductor pattern, a conductive pattern, a signal line, and so on. The insulation layer, a semiconductor layer, and a conductive layer may be formed on the base layer BS through coating, deposition, or the like, and then, the insulation layer, the semiconductor layer, and the conductive layer may be selectively patterned by performing a photolithography process and an etching process multiple times. Thereafter, the semiconductor pattern, the conductive pattern, and the signal line, which are included in the circuit layer CL, may be formed.

The light-emitting element layer EDL may be located on the circuit layer CL. The light-emitting element layer EDL may include a light-emitting element. For example, the light-emitting element may include an organic light-emitting material, an inorganic light-emitting material, an organic-inorganic light-emitting material, a quantum dot, a quantum rod, a micro-LED, or a nano-LED.

The encapsulation layer TFE may be located on the light-emitting element layer EDL. The encapsulation layer TFE may cover the light-emitting element layer EDL. The encapsulation layer TFE may be located in the active region AA, in which the light-emitting element layer EDL is located, and may be located extending to the peripheral region NAA in which the light-emitting element layer EDL is not located. The encapsulation layer TFE may protect the light-emitting element layer EDL from moisture, oxygen, and foreign matters, such as dust particles.

The sensor layer TP may be located on the display panel DP. The sensor layer TP may detect an external input applied from the outside. The external input may be a user's input. The user's input may include various types of external inputs, such as a part of a user's body, light, heat, pen or pressure.

The sensor layer TP may be formed on the display panel DP through a continuous process. In this case, the sensor layer TP may be located directly on the display panel DP. Here, "located directly on" may mean that a third component is not located between the two corresponding components (e.g., the sensor layer TP and the display panel DP). That is, a separate adhesive member might not be located between the sensor layer TP and the display panel DP. For example, the sensor layer TP may be located directly on the encapsulation layer TFE of the display panel DP. The sensor layer TP and the display panel DP may be bonded to each other through an adhesive member. The adhesive member may include a typical adhesive or gluing agent.

The optical layer RCL may be located on the sensor layer TP. The optical layer RCL may be located directly on the sensor layer TP. The optical layer RCL may be formed on the sensor layer TP through a continuous process. The optical layer RCL may reduce the reflectance of external light incident from the outside of the display module DM. The optical layer RCL may include a polarization layer, or may include a color filter layer. In one or more embodiments, the optical layer RCL may be omitted.

In one or more embodiments of the present disclosure, the sensor layer TP may be omitted. In this case, the optical layer RCL may be located directly on the display panel DP. In one or more embodiments, positions of the sensor layer TP and the optical layer RCL may be switched.

The display device DD may further include a driving unit DM-M electrically connected to the display module DM. The driving unit DM-M may be electrically connected to the display panel DP and the sensor layer TP. The driving unit DM-M may include a driving chip IC. The driving chip IC may generate or process various electrical signals, and the driving chip IC may be electrically connected to the display panel DP, the sensor layer TP, and so on, to control the display panel DP, the sensor layer TP, and so on.

The driving unit DM-M may include a flexible circuit board FB and a driving circuit board MB. The flexible circuit board FB may have one side, which is electrically connected to the display panel DP and the sensor layer TP, and the other side, which is electrically connected to the driving circuit board MB. The driving chip IC may be located on the flexible circuit board FB. In this case, the flexible circuit board FB may be also referred to as a chip on film (CoF). Unlike that illustrated, the driving chip IC may be located on the base layer BS of the display module DM.

FIG. 2 illustrates that the driving unit DM-M is connected to one side of the display module DM to be unfolded. However, the driving unit DM-M may be located to be bent in the fourth direction DR4. When located to be bent, the driving unit DM-M may be located to overlap the display panel DP on a plane.

The display device DD according to one or more embodiments may further include a window WM located on the display module DM. The window WM may cover the entire outside of the display module DM. The window WM may be bonded to the display module DM through an adhesive layer AP.

The window WM may have a shape corresponding to the shape of the display module DM. In the display device DD according to one or more embodiments, the window WM may include an optically transparent insulation material. The window WM may be a glass substrate or a polymer substrate. For example, the window WM may be a chemically strengthened glass substrate.

The window WM may be divided into a transmission part TA and a bezel part BZA. The transmission part TA may be a part corresponding to the active region AA of the display module DM, and the bezel part BZA may be a part corresponding to the peripheral region NAA of the display module DM. The bezel part BZA may define the shape of the transmission part TA. The bezel part BZA may be adjacent to the transmission part TA and surround the transmission part TA. However, one or more embodiments is not limited to that illustrated. The bezel part BZA may be located adjacent to only one side of the transmission part TA, and a portion thereof may be omitted.

Figure 4:
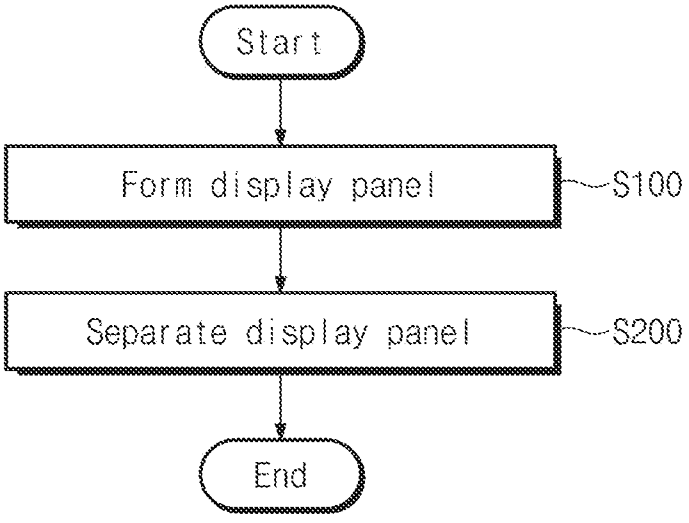
FIG. 4 is a flowchart illustrating a display device manufacturing method according to one or more embodiments of the present disclosure.

FIG. 4 is a flowchart illustrating a display device DD manufacturing method according to one or more embodiments of the present disclosure.

Referring to FIG. 4, the display device DD manufacturing method according to one or more embodiments of the present disclosure includes forming a display panel DP on a substrate for processing/processing substrate PS (S100) and separating the display panel DP from the processing substrate PS by emitting laser (S200).

A preliminary display panel DP-a (e.g., see FIG. 5E) is one state during a process for manufacturing the display panel DP and may be defined as a plurality of display panels DP formed on the processing substrate PS. That is, the preliminary display panel DP-a may include the plurality of display panels DP, and here, a base layer BS included in the plurality of display panels DP may be integrally provided in the preliminary display panel DP-a. Thereafter, the preliminary display panel DP-a may be cut into cell units through a cutting process to manufacture the plurality of display panels DP spaced apart from each other.

For example, one preliminary display panel DP-a may be cut to manufacture three display panels DP. However, the one preliminary display panel DP-a is not necessarily provided to manufacture several display panels DP, and the one preliminary display panel DP-a may be provided to manufacture a single display panel DP.

Hereinafter, operations of the manufacturing method before the cutting process will be described using the preliminary display panel DP-a. For example, the forming of the display panel DP on the processing substrate PS (S100), and the separating of the display panel DP from the processing substrate PS by emitting the laser (S200), may be described as forming the preliminary display panel DP-a on the processing substrate PS, and separating the preliminary display panel DP-a from the processing substrate PS by emitting the laser, respectively.

The forming of the preliminary display panel DP-a on the processing substrate PS may be an operation, in which the preliminary display panel DP-a is formed directly on the processing substrate PS without a third layer between the processing substrate PS and the preliminary display panel DP-a, or alternatively may be an operation in which, as described later, the third layer, such as a sacrificial layer SL (e.g., see FIG. 10A), is formed on the processing substrate PS, and then the preliminary display panel DP-a is formed on the third layer.

The processing substrate PS may be a substrate for supporting or protecting the preliminary display panel DP-a. The processing substrate PS may be a rigid substrate. For example, the processing substrate PS may be a glass substrate. The preliminary display panel DP-a may be formed on the processing substrate PS, and then the processing substrate PS may be removed from the preliminary display panel DP-a.

Figure 5A:
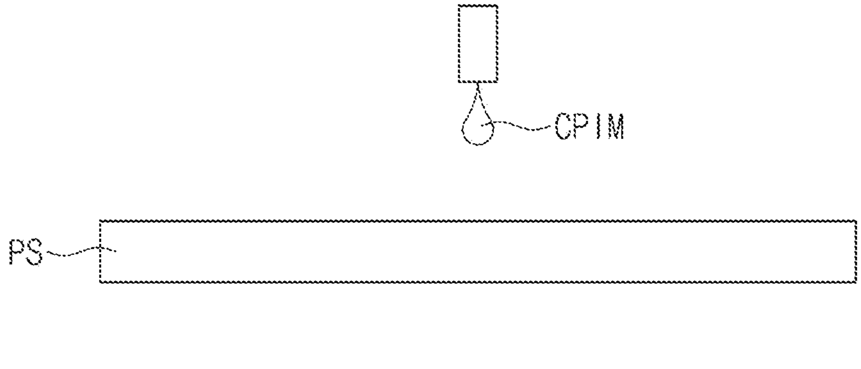
FIGS. 5A to 5L are cross-sectional views illustrating one operation of a display device manufacturing method according to one or more embodiments of the present disclosure.
Figure 5B:
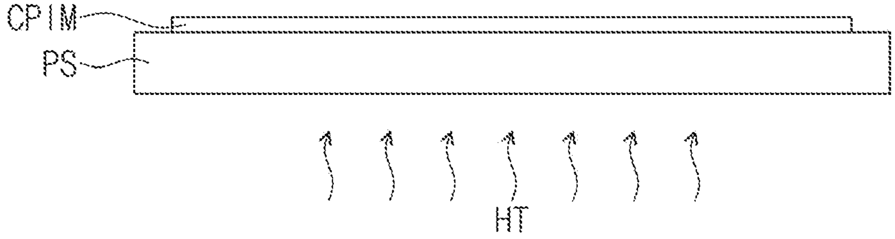
Figure 5C:
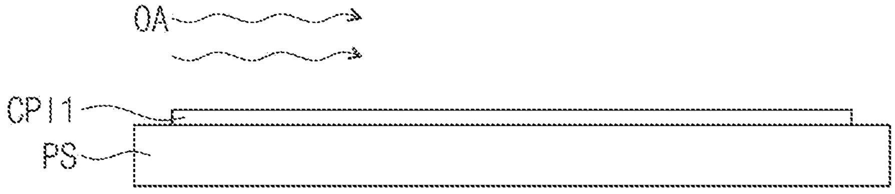
Figure 5D:
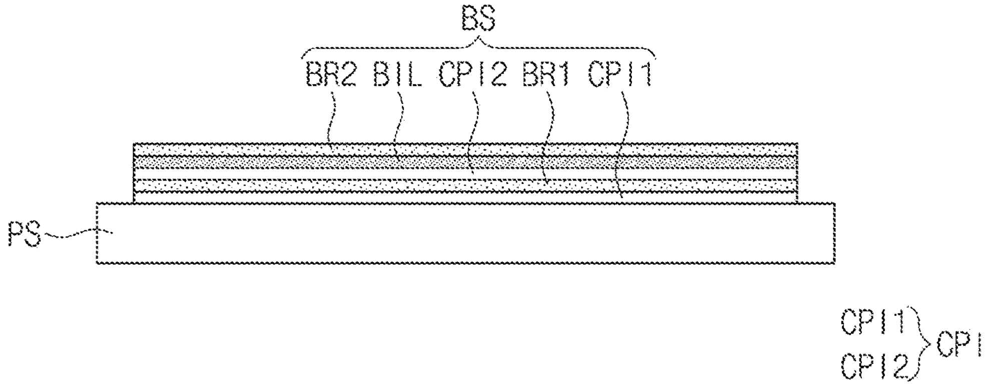

The forming of the preliminary display panel DP-a on the processing substrate PS includes forming a base layer BS including a colorless polyimide layer CPI (e.g., see FIG. 5D) and a functional layer BIL (e.g., see FIG. 5D).

The base layer BS may be a member that provides a base surface on which the circuit layer CL is located. The base layer BS may be a rigid substrate, or a flexible substrate that is bendable, foldable, rollable, or the like. The base layer BS may be a glass substrate, a metal substrate, a polymer substrate, or the like.

The base layer BS may have a multilayer structure. The base layer BS includes the colorless polyimide layer CPI and the functional layer BIL.

The colorless polyimide layer CPI may be a layer including a colorless polyimide. The colorless polyimide is provided by replacing or adding a trifluoromethyl group (—$CF_3$), an ether group (—O—), or a sulfonyl group (—$SO_2$) with or to a substituent of a polyimide (PI) to make the polyimide colorless. Accordingly, the base layer BS including the colorless polyimide layer CPI may have the improved transmittance as compared to a general polyimide.

The colorless polyimide layer CPI according to one or more embodiments may have a yellow index of about 7 or less, and a light transmittance of about 83% or greater in a visible wavelength region. For example, the colorless polyimide having a trifluoromethyl group (—$CF_3$) introduced thereinto may have a yellow index (YI) of about 4.5 and a transmittance of about 86% or greater in the visible wavelength region.

The colorless polyimide is a polymer material with high thermal stability, and may have relatively excellent, or high, mechanical strength, heat resistance, and electrical insulation properties. The colorless polyimide has flexibility and thus, may be suitable for a substrate of a flexible display panel.

The functional layer BIL may include a silicon oxide ($SiO_x$). The base layer BS includes the functional layer BIL so that a likelihood of damage to layers at a side opposite to a side irradiated with laser on the basis of the functional layer BIL (e.g., due to the laser in the separating of the preliminary display panel DP-a), may be reduced or prevented, which will be described later.

The functional layer BIL may be formed through chemical vapor deposition (CVD).

In one or more embodiments, the forming of the base layer BS may include forming the colorless polyimide layer CPI and forming the functional layer BIL. The forming of the colorless polyimide layer CPI may include applying a colorless polyimide material CPIM (e.g., see FIG. 5A), curing HT (e.g., see FIG. 5B) the applied colorless polyimide material CPIM at a curing temperature of higher than about 430° C. and lower than or equal to about 470° C. for about 10 minutes to about 30 minutes, and cooling the cured colorless polyimide material with outside air OA (e.g., see FIG. 5C).

Figure 6:
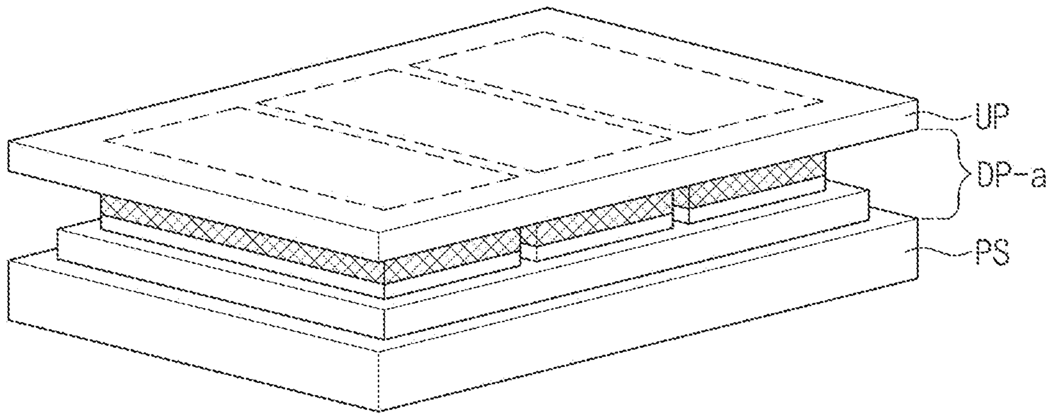
FIG. 6 is a perspective view illustrating one operation of a display device manufacturing method according to one or more embodiments of the present disclosure.
Figure 7:
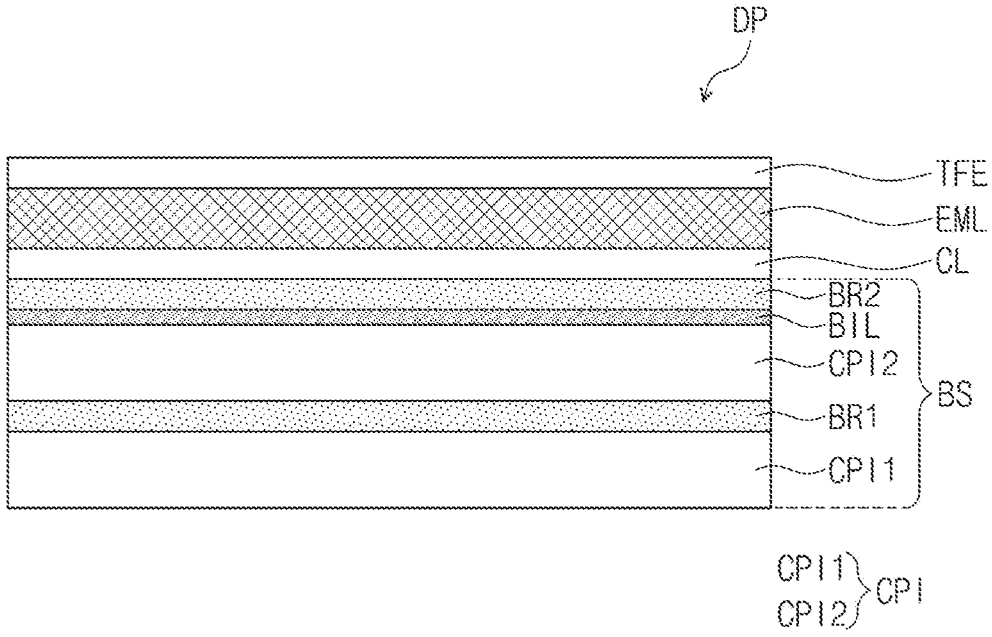
FIG. 7 is a cross-sectional view of a display panel according to one or more embodiments of the present disclosure.
Figure 8:
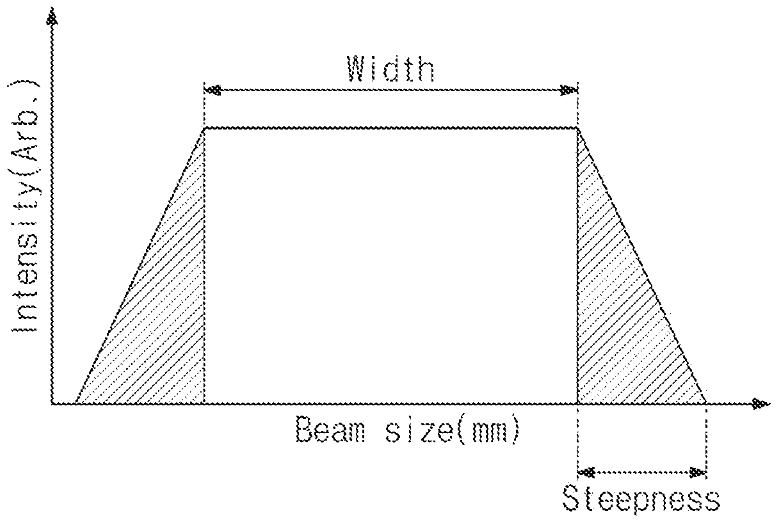
FIG. 8 is a view illustrating a beam shape of a laser minor axis according to one or more embodiments of the present disclosure.
Figure 9:
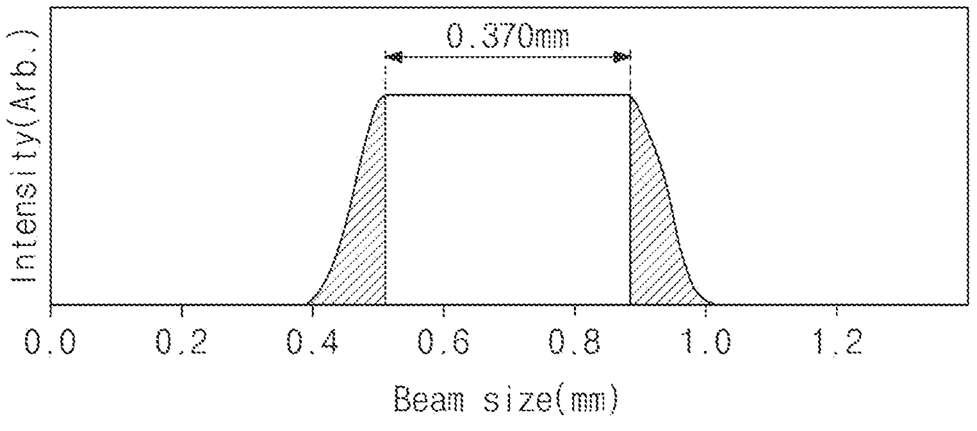
FIG. 9 is a view illustrating a beam shape of a laser minor axis according to one or more embodiments of the present disclosure.

FIGS. 5A to 5L are cross-sectional views illustrating one operation of a display device manufacturing method according to one or more embodiments of the present disclosure. FIG. 6 is a perspective view illustrating one operation of a display device manufacturing method according to one or more embodiments of the present disclosure. FIG. 7 is a cross-sectional view of a display panel DP according to one or more embodiments of the present disclosure. FIGS. 8 and 9 are each a view illustrating a beam shape of a laser minor axis according to one or more embodiments of the present disclosure.

FIGS. 5A to 5C are cross-sectional views illustrating an operation of forming a first colorless polyimide layer CPI1 according to one or more embodiments. FIG. 5A illustrates an operation of applying a colorless polyimide material CPIM on a processing substrate PS. FIG. 5B illustrates an operation of curing HT the applied colorless polyimide material CPIM. FIG. 5C illustrates an operation of cooling the cured first colorless polyimide layer CPI1 with outside air OA.

The same description of the forming of the first colorless polyimide layer CPI1 described with reference to FIGS. 5A to 5C may apply to the colorless polyimide layer CPI described above and a second colorless polyimide layer CPI2 (e.g., see FIG. 5D) to be described later.

The applied colorless polyimide material CPIM may be cured at a curing temperature of higher than about 430° C. and lower than or equal to about 470° C. for about 10 minutes to about 30 minutes. In addition, the cooling may be performed in a state in which a furnace is opened and outdoor air flows. That is, the outside air OA may mean the outdoor air.

In one or more embodiments, the curing may further include raising a temperature from about 180° C. to the curing temperature for about 4 minutes to about 6 minutes. For example, when the curing temperature is about 450° C., the applied colorless polyimide material CPIM may be heated from about 180° C. to about 450° C. for about 5 minutes.

When the curing is performed at the temperature and for the time and the cooling is performed with the outside air OA, the adhesion of the formed colorless polyimide layer CPI may be improved to about 500 gf/in or greater. For example, the adhesion of the colorless polyimide layer CPI may be improved to about 600 gf/in or greater, and may be improved to about 1000 gf/in or greater. That is, the adhesion of the colorless polyimide layer CPI may be improved to reduce a separation defect between the processing substrate PS and the preliminary display panel DP-a in the separating of the preliminary display panel DP-a, which will be described later.

For example, when the adhesion between respective layers included in the base layer BS is less than the adhesion between the processing substrate PS and the preliminary display panel DP-a, the respective layers included in the base layer BS may be separated, and the separation defect between the processing substrate PS and the preliminary display panel DP-a may occur. Thus, the colorless polyimide layer CPI may be cured at the corresponding temperature, for the corresponding time, and under the corresponding cooling condition, to thereby improve the adhesion between the respective layers included in the base layer BS.

For example, under the curing conditions, the adhesion between the first colorless polyimide layer CPI1 (see FIG. 5D) and the first barrier layer BR1 (see FIG. 5D), between the first barrier layer BR1 (see FIG. 5D) and the second colorless polyimide layer CPI2 (see FIG. 5D), or between the second colorless polyimide layer CPI2 (see FIG. 5D) and the functional layer BIL (see FIG. 5D), may be improved. That is, the colorless polyimide layer CPI is cured under the conditions so that the respective layers included in the base layer BS may not be separated in the separating of the preliminary display panel DP-a.

In one or more embodiments, the colorless polyimide layer CPI may include a full aromatic polyimide including at least one of a trifluoromethyl group (—$CF_3$), an ether group (—O—), or a sulfonyl group (—$SO_2$). A full aromatic is a substance that follows Huckel's rule, and may mean a substance that satisfies the following four conditions. The full aromatic is a cyclic compound (condition 1), a three-dimensional shape of a molecule is a plane (condition 2), each atom has at least one p-orbital and is fully conjugated (condition 3), and the number of $\pi$ electrons satisfies (4n+2) (condition 4). In addition, a semi aromatic means a substance including an aromatic, which satisfies conditions 1 to 3 above, but does not satisfy condition 4 above, and an aliphatic. The colorless polyimide layer CPI is a full aromatic polyimide including at least one of a trifluoromethyl group (—$CF_3$), an ether group (—O—), or a sulfonyl group (—$SO_2$), and is transparent and also has more excellent thermal stability than the semi-aromatic polyimide.

The colorless polyimide included in the colorless polyimide layer CPI may further include an ether group (—O—) and/or a hydroxyl group (—OH) in addition to a trifluoromethyl group (—$CF_3$). The colorless polyimide of the colorless polyimide layer CPI further includes the ether group (—O—) and/or the hydroxyl group (—OH), and thus the viscosity and laser reactivity of the colorless polyimide may be adjusted.

In one or more embodiments, the first colorless polyimide layer CPI1 and the second colorless polyimide layer CPI2 may each include a polyimide having a decomposition temperature (Td) of about 524° C. The decomposition temperature means a temperature at which weight loss of a substance is about 5%. The first colorless polyimide layer CPI1 and the second colorless polyimide layer CPI2 are excellent in the thermal stability, and thus may be suitable to apply to a substrate of the display panel DP accompanying a high temperature process.

When the colorless polyimide layer CPI includes the trifluoromethyl group (—$CF_3$), the colorless polyimide layer CPI may further include an additive. For example, the additive may be $H_2O$ available as a solvent.

In one or more embodiments, the colorless polyimide layer CPI may include the first colorless polyimide layer CPI1 and the second colorless polyimide layer CPI2. The same description of the colorless polyimide layer CPI described above will apply to the first colorless polyimide layer CPI1 and the second colorless polyimide layer CPI2.

FIG. 5D illustrates an operation in which the first colorless polyimide layer CPI1, the first barrier layer BR1, the second colorless polyimide layer CPI2, the functional layer BIL, and the second barrier layer BR2 are formed in sequence on the processing substrate PS to form the base layer BS.

In one or more embodiments, the forming of the base layer BS may include forming the first colorless polyimide layer CPI1 on the processing substrate PS, forming the first barrier layer BR1 on the first colorless polyimide layer CPI1, forming the second colorless polyimide layer CPI2 on the first barrier layer BR1, forming the functional layer BIL on the second colorless polyimide layer CPI2, and forming a second barrier layer BR2 on the functional layer BIL.

The thickness of the base layer BS illustrated in FIG. 5D is intended to illustrate each of layers included in the base layer BS, and not to illustrate the thickness of the actual base layer BS or the thicknesses of the respective layers included in the base layer BS.

The base layer BS includes the first barrier layer BR1 and the second barrier layer BR2 so that external oxygen and moisture may be blocked. In addition, the base layer BS may support the flexible colorless polyimide layer CPI.

Each of the first barrier layer BR1 and the second barrier layer BR2 may be an inorganic layer, and may include, for example, at least one of a silicon oxide ($SiO_x$), a silicon nitride ($SiN_y$), or a silicon oxynitride ($SiO_xN_y$).

The base layer BS includes the functional layer BIL so that damage (e.g., due to the laser in the separating of the preliminary display panel DP-a) to layers, which are located at a side opposite to a side irradiated with laser on the basis of the functional layer BIL, may be reduced or prevented, as will be described later.

The functional layer BIL is formed between the second colorless polyimide layer CPI2 and the second barrier layer BR2 so that stress between the second colorless polyimide layer CPI2 and the second barrier layer BR2 may be reduced to improve wrinkles.

In one or more embodiments, the forming of the functional layer BIL may include forming the functional layer BIL to a thickness of about 500 Å to about 5000 Å. For example, the functional layer BIL may have a thickness of about 500 Å to about 3000 Å, or may have a thickness of about 500 Å to about 1000 Å. The functional layer BIL is formed to have the thickness in the range so that the stress between the second colorless polyimide layer CPI2 and the second barrier layer BR2 may be matched to reduce wrinkles and curl more effectively.

Figure 5E:
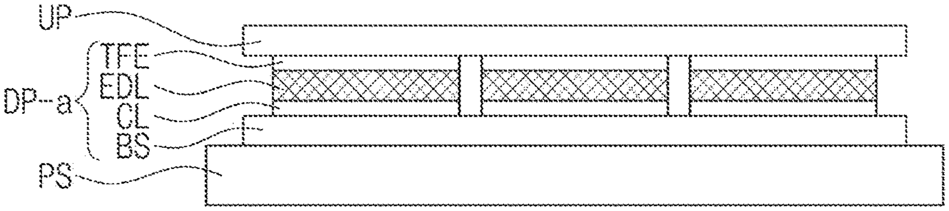

FIG. 5E illustrates layers that may be formed on the base layer BS of the preliminary display panel DP-a. FIG. 6 is a perspective view of FIG. 5E.

Referring to FIGS. 5E to 6 together, the forming of the preliminary display panel DP-a may further include forming the circuit layer CL on the base layer BS that is formed on the processing substrate PS, forming a light-emitting element layer EDL on the circuit layer CL, and forming an encapsulation layer TFE on the light-emitting element layer EDL. In addition, forming an upper protective film UP on the encapsulation layer TFE may be further included.

The base layer BS, the circuit layer CL, the light-emitting element layer EDL, and the encapsulation layer TFE are the same as those described above. The upper protective film UP may be provided to support and protect the preliminary display panel DP-a from the outside during processes.

The display device DD manufacturing method according to one or more embodiments of the present disclosure includes the separating of the preliminary display panel DP-a from the processing substrate PS by emitting laser.

Figure 5F:
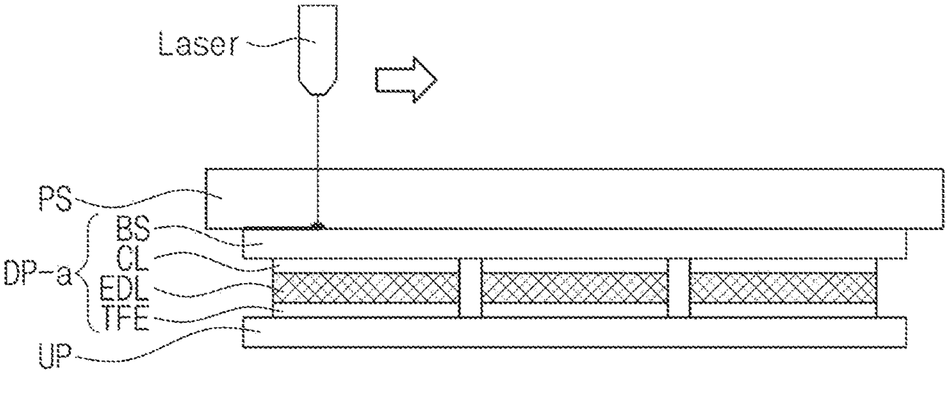

For example, the processing substrate PS, the preliminary display panel DP-a, and the upper protective film UP, as in FIG. 5E, may be moved to a laser stage to be irradiated with the laser in a reversed state, as shown in FIG. 5F.

FIG. 5F illustrates an operation in which the laser is emitted. Referring to FIG. 5F, the laser may be emitted in a direction from the processing substrate PS toward the preliminary display panel DP-a. The laser may pass through the processing substrate PS to be absorbed by an upper portion of the base layer BS. For example, when the processing substrate PS is a glass substrate, the laser having a wavelength of about 308 nm may have a transmittance of about 47%.

In one or more embodiments, the laser may be absorbed by the colorless polyimide layer CPI of the base layer BS. The colorless polyimide layer CPI may absorb about 90% or more of the laser. For example, the colorless polyimide layer CPI may absorb about 100% of the laser having a wavelength of about 308 nm.

The colorless polyimide layer CPI may absorb the emitted laser to break covalent bonds constituting the colorless polyimide. For example, the colorless polyimide including a trifluoromethyl group (—$CF_3$) may further include an ether group (—O—) and/or a hydroxyl group (—OH), and may absorb the emitted laser to break covalent bonds between O—C of the colorless polyimide. Accordingly, the adhesion of a surface of the first colorless polyimide layer CPI1 in contact with the processing substrate PS may change to separate the preliminary display panel DP-a from the processing substrate PS.

In one or more embodiments, the laser may have an intensity such that about 90% of a maximum intensity is about 6.0 MW/cm$^2$ to about 6.8 MW/cm$^2$. When emitting the laser having the intensity, the preliminary display panel DP-a may be normally separated from the processing substrate PS.

The intensity of the laser may be defined as output of laser (laser peak power) emitted per effective area, as in the following equation:

$$\text{Intensity}\left[\frac{\text{W}}{\text{cm}^2}\right] = \frac{\text{Laser peak power[W]}}{\text{Effective area}[\text{cm}^2]}$$

Accordingly, the effective area irradiated with the laser may be adjusted to adjust the intensity of the laser. For example, to adjust the intensity of the laser to be in the foregoing range, a minor axis of the laser may be adjusted to have a width of about 370 μm to about 400 μm, and to have a steepness of about 30 μm to about 60 μm.

Referring to FIG. 8, the minor axis of the laser according to one or more embodiments may have a beam shape of an isosceles trapezoid.

In one or more embodiments, as illustrated in FIG. 8, the width of the laser minor axis may mean a length (beam size) of a rectangular portion in an isosceles trapezoid-shaped graph, and the steepness may mean a length (beam size) of a hatched triangular portion in the isosceles trapezoid-shaped graph.

In one or more embodiments, the laser may have a wavelength of about 300 nm to about 400 nm. For examples, the wavelength may be about 308 nm. The laser having the wavelength may be emitted to normally separate the preliminary display panel DP-a from the processing substrate PS.

Referring to FIG. 9, in one or more embodiments, the width of the laser minor axis may be about 0.370 mm, and the steepness of the laser minor axis may be about 30 μm to about 60 μm.

Figure 5G:
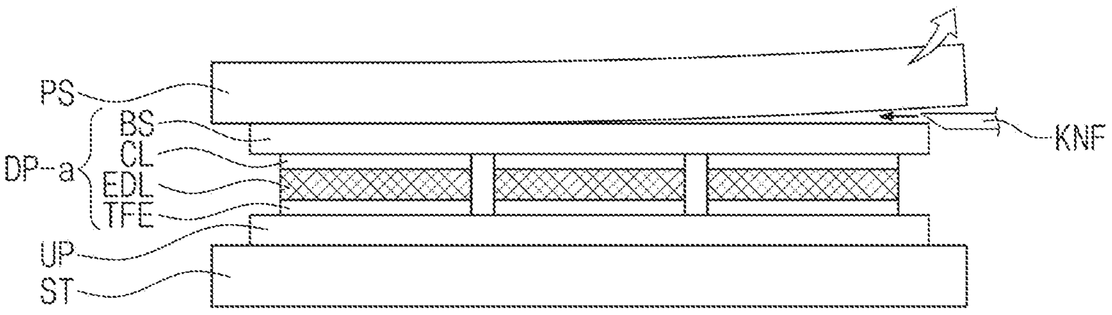
Figure 5H:
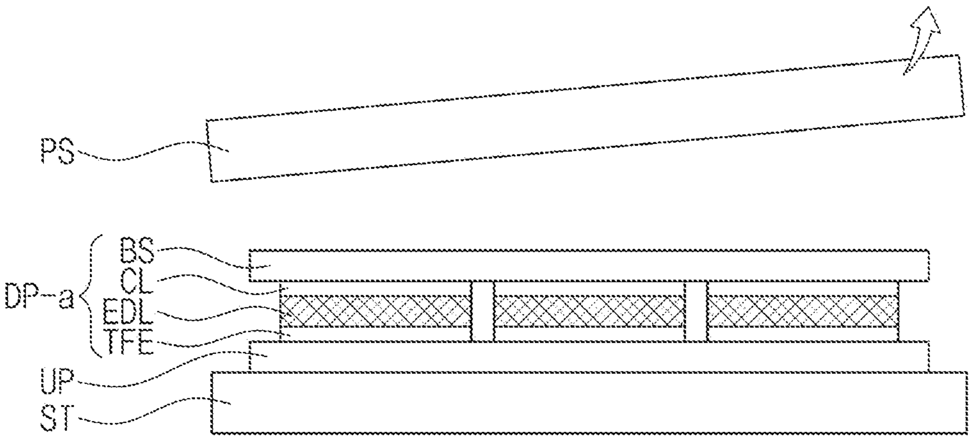

FIGS. 5G and 5H each illustrate an operation in which the processing substrate PS is separated from the preliminary display panel DP-a after the laser is emitted.

Referring to FIG. 5G, after the emitting of the laser, the upper protective film UP, the preliminary display panel DP-a, and the processing substrate PS may be moved to a removal module. The processing substrate PS and the base layer BS may be separated from each other using, for example, a knife KNF in a state in which a surface of the upper protective film UP is adsorbed on an adsorption stage ST of the removal module. FIG. 5H illustrates a state in which the processing substrate PS is fully removed from the preliminary display panel DP-a.

FIGS. 5I to 5L each illustrate an operation that may be added after the separating of the preliminary display panel DP-a from the processing substrate PS by emitting the laser.

Figure 5I:
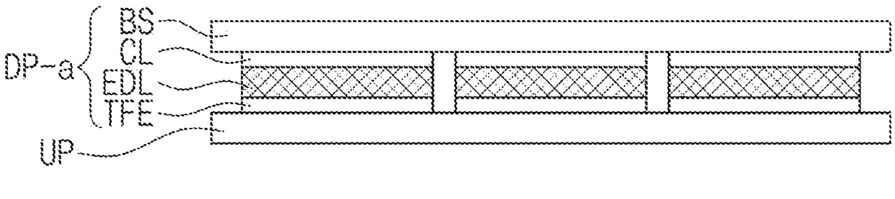

Referring to FIG. 5I, the display device DD manufacturing method according to one or more embodiments may further include unloading the upper protective film UP and the preliminary display panel DP-a from the removal module. FIG. 5I illustrates a state in which the upper protective film UP and the preliminary display panel DP-a are unloaded from the removal module. For example, the state may mean an operation in which after the removing of the processing substrate PS from the preliminary display panel DP-a in FIG. 5H is finished, the adsorbing of the surface of the upper protective film UP on the adsorption stage ST of the removal module is stopped, and the surface of the upper protective film UP is separated and spaced apart from the removal module.

Figure 5J:
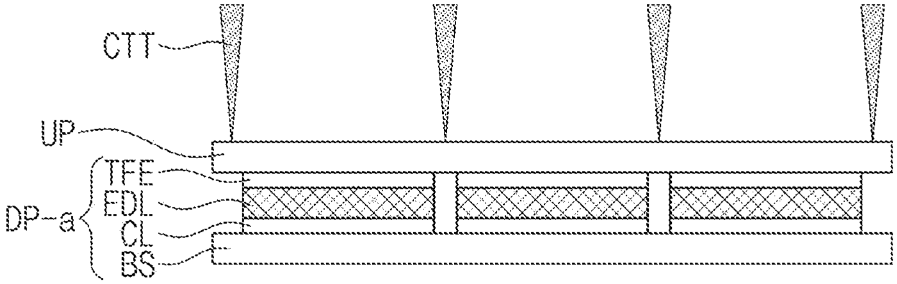
Figure 5K:
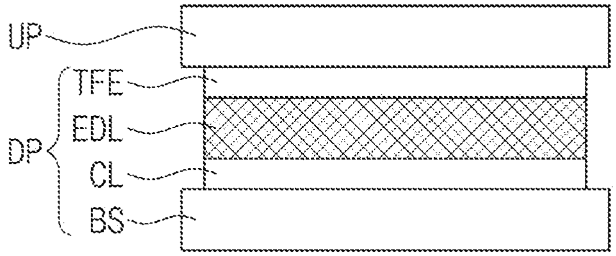

Referring to FIGS. 5J and 5K, in the display device DD manufacturing method according to one or more embodiments, the unloaded upper protective film UP and preliminary display panel DP-a are reversed top-to-bottom, and then are cut using a cutter CTT to thereby manufacture several display panels DP. However, the cutting method is not limited to the cutting method using the cutter CTT, and the cutting may be performed using, for example, one or more lasers. FIG. 5K illustrates the display panel DP and the upper protective film UP after the cutting.

Figure 5L:
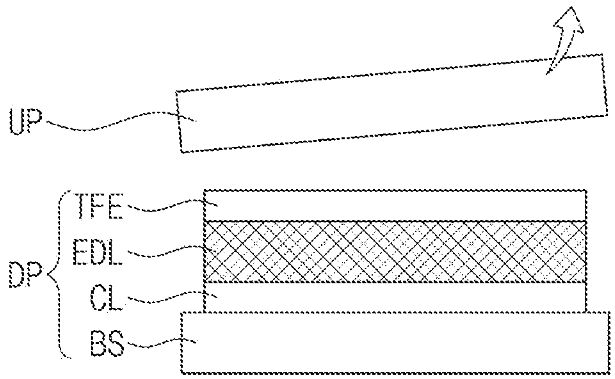

Referring to FIG. 5L, the display device DD manufacturing method according to one or more embodiments may further include, after the cutting of the upper protective film UP and the preliminary display panel DP-a, forming the display panel DP by removing the upper protective film UP from the display panel DP.

FIG. 7 is a cross-sectional view of one or more embodiments of the display panel DP completed after the forming of the preliminary display panel DP-a on the processing substrate PS and the separating of the preliminary display panel DP-a from the processing substrate PS by emitting the laser, which are described above with reference to FIGS. 5A to 5L.

Referring to FIG. 7, the display panel DP according to one or more embodiments of the present disclosure may include a base layer BS, a circuit layer CL located on the base layer BS, a light-emitting element layer EDL located on the circuit layer CL, and an encapsulation layer TFE located on the light-emitting element layer EDL.

The base layer BS may include a first colorless polyimide layer CPI1, a first barrier layer BR1 located on the first colorless polyimide layer CPI1, a second colorless polyimide layer CPI2 located on the first barrier layer BR1, a functional layer BIL including a silicon oxide and located on the second colorless polyimide layer CPI2, and a second barrier layer BR2 located on the functional layer BIL.

The display device DD manufacturing method according to one or more embodiments may further include forming, on the processing substrate PS, a sacrificial layer SL including amorphous silicon. In this case, the forming of the preliminary display panel DP-a, may include forming the preliminary display panel DP-a on the sacrificial layer SL including the amorphous silicon.

Figure 10A:
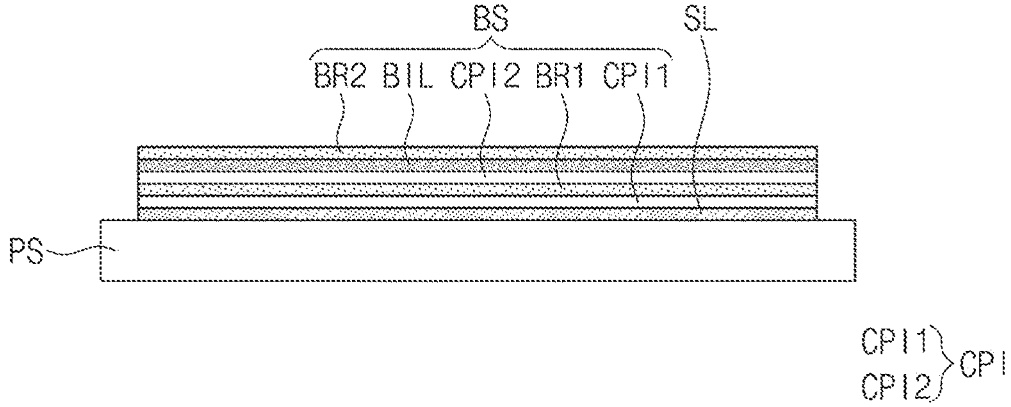
FIGS. 10A to 10C are cross-sectional views illustrating one operation of a display device manufacturing method according to one or more embodiments of the present disclosure.
Figure 10B:
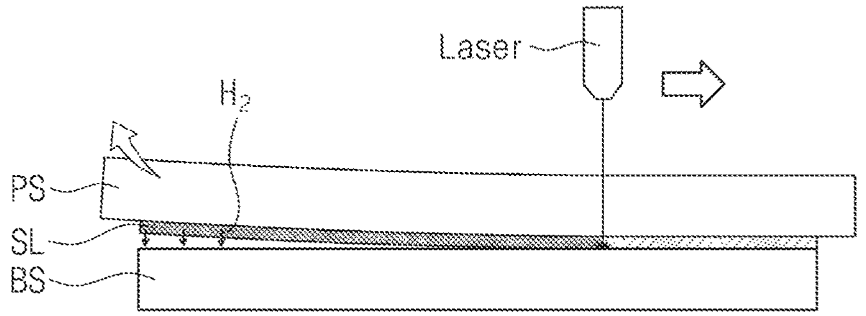
Figure 10C:

FIGS. 10A to 10C are cross-sectional views illustrating one operation of a display device DD manufacturing method according to one or more embodiments of the present disclosure. FIGS. 10A to 10C illustrates the base layer BS alone with respect to the preliminary display panel DP-a described above, and the other layers are omitted.

FIG. 10A illustrates an operation of forming the sacrificial layer SL including the amorphous silicon, and then forming the base layer BS on the sacrificial layer SL without forming the base layer BS directly on the processing substrate PS.

FIG. 10B illustrates an operation in which the processing substrate PS, the sacrificial layer SL, and the base layer BS in FIG. 10A are reversed, and laser is emitted in a direction from the processing substrate PS to the sacrificial layer SL. The amorphous silicon included in the sacrificial layer SL irradiated with the laser may be crystallized to be multicrystalline silicon, and a hydrogen ($H_2$) gas may be generated by a dehydrogenation reaction. Due to the generated $H_2$ gas, the sacrificial layer SL may be separated from the base layer BS.

In one or more embodiments, the wavelength of the laser for separating the sacrificial layer SL from the base layer BS may be about 300 nm to about 400 nm. For example, the wavelength may be about 308 nm. The laser having the wavelength may be emitted to normally separate the base layer BS from the processing substrate PS.

FIG. 10C illustrates the base layer BS in a state in which the processing substrate PS and the sacrificial layer SL are separated and removed.

Table 1 below shows results obtained by testing whether a base layer is normally detached.

Table 1 shows the test results of Example 1, which may correspond to one or more embodiments of the present disclosure, and Comparative Example 1.

In Example 1, a glass substrate was used as a processing substrate, and a base layer of the Example, which includes a first colorless polyimide layer, a first barrier layer, a second colorless polyimide layer, a functional layer, and a second barrier layer, was formed on the glass substrate. The processing substrate, the first colorless polyimide layer, the first barrier layer, the second colorless polyimide layer, the functional layer, and the second barrier layer in Example 1, may correspond to the processing substrate PS, the first colorless polyimide layer CPI1, the first barrier layer BR1, the second colorless polyimide layer CPI2, the functional layer BIL, and the second barrier layer BR2, respectively, which are described above.

Here, the first colorless polyimide layer and the second colorless polyimide layer were cured by heating from about 180° C. to about 450° C. for about 5 minutes and holding for about 30 minutes, and then, cooled with outside air flowing.

The processing substrate and the base layer formed on processing substrate were reversed top-to-bottom, and then irradiated with excimer laser having an intensity shown in Table 1 below, and having a wavelength of about 308 nm, in a direction from the processing substrate to the base layer. Thereafter, the processing substrate was separated to obtain the results as shown in Table 1 below.

In Comparative Example 1, a glass substrate was used as a processing substrate, and a base layer of the Comparative Example, which includes a first colorless polyimide layer, a first barrier layer, a second colorless polyimide layer, and a second barrier layer, was formed on the glass substrate.

The base layer of the Comparative Example, when compared to the base layer of the Example, did not include a functional layer, and when formed, the first colorless polyimide layer and the second colorless polyimide layer were cured by heating from about 180° C. to about 430° C. for about 5 minutes, and holding for about 10 minutes, and then, cooled with outside air flowing. The intensity of the emitted laser is as shown in Table 1 below.

In Table 1, an ash average is a value obtained by measuring the visible light transmittance of the base layer after irradiating the base layer with the laser. The ash generated when the base layer was irradiated with the laser may affect the transmittance of the base layer. For example, as more ash is generated, the visible light transmittance of the base layer may be reduced to cause a decrease in the ash average.

TABLE 1

| | Adhesion | Coating uniformity | Excimer Laser Peeler (ELP) beam shape | Laser intensity @90% | Ash average | Normal detachment |
|---|---|---|---|---|---|---|
| Example 1 | 636 gf/in or greater | 5% or less | isosceles trapezoid | 6.0-6.8 $MW/cm^2$ | 84% or greater | ○ |
| Comparative Example 1 | 239 gf/in | 10% or less | isosceles trapezoid | 5.9 $MW/cm^2$ | 75% or less | X |

Referring to Table 1, Example 1 shows the improved adhesion of the colorless polyimide layer and the improved coating uniformity when compared to Comparative Example 1. While Example 1 shows the ash average of about 84% or greater and the normal detachment from the glass substrate, Comparative Example 1 shows the ash average of about 75% or less, and has no region observed to be normally detached from the glass substrate (e.g., shows abnormal detachment from the glass substrate).

In Comparative Example 1, the adhesion of the colorless polyimide layer is relatively low, and the intensity of the laser is relatively low, so that the base layer was not normally separated from the glass substrate.

In Example 1, however, the curing conditions of the colorless polyimide layer were adjusted to emit the laser having the intensity sufficient to improve the adhesion, and to change the physical properties of the colorless polyimide layer, so that the base layer could be normally separated from the glass substrate.

Table 2 below shows results obtained by testing adhesion of a colorless polyimide layer according to curing conditions.

In Example 2, which may correspond to one or more embodiments of the present disclosure, a colorless polyimide was applied, curing was performed by heating from about 180° C. to about 450° C. for about 5 minutes and holding for about 30 minutes, and then, cooling was performed with outside air flowing.

In Example 3, which may correspond to one or more embodiments of the present disclosure, and Comparative Examples 2 and 3, the curing temperature, the temperature-raising time, the hold time, or the cooling condition was changed as in Table 2 below with respect to Example 2.

Table 2 shows the curing conditions and adhesion measurement results of Examples 2 and 3 and Comparative Examples 2 and 3.

The temperature-raising time means a time suitable for raising a temperature from about 180° C. to a curing temperature. In the cooling condition, outside air ON indicates cooling with a furnace opened and outdoor air flowing, and outside air OFF indicates cooling with a furnace closed.

2 and 3. For example, in Examples 2 and 3, the adhesion values of the colorless polyimide layers were measured to be about 636 gf/in and about 505.3 gf/in, respectively.

In Comparative Example 2, when compared to Comparative Example 3, the cure hold time was longer, but the cooling was performed in the outside air OFF state, and the adhesion was measured to be remarkably low. Accordingly, it is considered that allowing the outside air to flow in the cooling condition is necessary to improve the adhesion.

In Example 3, the curing condition was changed to about 450° C. when compared to Comparative Example 3. Accordingly, it may be confirmed that the adhesion was improved to about 505.3 gf/in.

In Example 2, the cure hold time was changed to about 30 minutes with respect to Example 3. It may be confirmed that the adhesion was further improved when compared to the cure hold time of about 10 minutes.

Referring to Tables 1 and 2, in one or more embodiments of the present disclosure, the curing condition of the colorless polyimide layer may be adjusted to improve the adhesion, thereby allowing for normal separation of the display panel from the processing substrate. In addition, the functional layer may be added to reduce the stress between the colorless polyimide layer and the barrier layer, thereby improving the wrinkles and reducing or preventing damage to the layers stacked above the functional layer due to the laser. Moreover, in one or more embodiments of the present disclosure, the laser having the intensity (e.g., predetermined intensity) may be emitted to normally separate the display panel from the processing substrate PS.

The display device DD manufacturing method according to one or more embodiments of the present disclosure may effectively separate the base layer BS including the colorless polyimide layer CPI from the processing substrate.

The display device DD according to one or more embodiments of the present disclosure may include the colorless polyimide layer CPI to improve the transmittance, and may include the functional layer BIL to improve the processability.

The display device manufacturing method according to one or more embodiments may effectively separate the

TABLE 2

| | Curing temperature | Temperature-raising time | Hold time | Cooling condition | Adhesion |
|---|---|---|---|---|---|
| Example 2 | 450° C. | 5 min. | 30 min. | Outside air ON | 636 gf/in |
| Example 3 | 450° C. | 5 min. | 10 min. | Outside air ON | 505.3 gf/in |
| Comparative Example 2 | 430° C. | 5 min. | 30 min. | Outside air OFF | 21.5 gf/in |
| Comparative Example 3 | 430° C. | 5 min. | 10 min. | Outside air OFF | 293 gf/in |

Referring to Table 2, it may be confirmed that Examples 2 and 3 show the improved adhesion of the colorless polyimide layer when compared to Comparative Examples display panel from the processing substrate with respect to the display device to which the colorless polyimide is applied.

For example, the functional layer may be added to improve the wrinkles when the display panel is separated from the processing substrate, and may reduce or prevent damage to the layers formed above the functional layer from due to the laser. Moreover, the curing conditions of the colorless polyimide layer may be adjusted to improve the adhesion, and the intensity of the laser may be adjusted to provide the energy sufficient to separate the colorless polyimide layer.

In the display device according to one or more embodiments, the display panel may include the colorless polyimide layer to improve the transmittance, and the display panel may include the functional layer to improve the processability.

Although the embodiments of the present disclosure have been described, it is understood that the present disclosure should not be limited to these embodiments, but various changes and modifications can be made by one ordinary skilled in the art within the spirit and scope of the present disclosure as hereinafter claimed.

Therefore, the technical scope of the present disclosure is not limited to the contents described in the detailed description of the specification, but should be determined by the claims, with functional equivalents thereof to be included therein.

What is claimed is:

1. A display device manufacturing method comprising:

forming a display panel on a processing substrate by forming a base layer comprising a colorless polyimide layer, and a functional layer; and separating the display panel from the processing substrate by emitting laser having an intensity such that about 90% of a maximum intensity is about 6.0 $MW/cm^2$ to about 6.8 $MW/cm^2$, wherein the forming of the base layer comprises:

forming the colorless polyimide layer by applying a colorless polyimide material, curing the colorless polyimide material at a curing temperature that is higher than about 430° C. and that is lower than or equal to about 470° C. for about 10 minutes to about 30 minutes, and cooling the colorless polyimide material with outside air; and forming the functional layer.

2. The display device manufacturing method of claim 1, wherein the curing further comprises raising a temperature from about 180° C. to the curing temperature for about 4 minutes to about 6 minutes.

3. A display device manufacturing method comprising:

forming a display panel on a processing substrate by forming a base layer comprising a colorless polyimide layer, and a functional layer; and separating the display panel from the processing substrate by emitting laser having an intensity such that about 90% of a maximum intensity is about 6.0 $MW/cm^2$ to about 6.8 $MW/cm^2$.

4. The display device manufacturing method of claim 3, wherein the colorless polyimide layer comprises a fully aromatic polyimide comprising at least one of a trifluoromethyl group, an ether group, or a sulfonyl group.

5. The display device manufacturing method of claim 3, wherein the colorless polyimide layer has a yellow index of about 7 or less, and a light transmittance of about 83% or greater in a visible wavelength region.

6. The display device manufacturing method of claim 3, wherein the functional layer comprises a silicon oxide.

7. The display device manufacturing method of claim 3, wherein the colorless polyimide layer comprises a first colorless polyimide layer and a second colorless polyimide layer, and wherein the forming of the base layer comprises forming the first colorless polyimide layer on the processing substrate, forming a first barrier layer on the first colorless polyimide layer, forming the second colorless polyimide layer on the first barrier layer, forming the functional layer on the second colorless polyimide layer, and forming a second barrier layer on the functional layer.

8. The display device manufacturing method of claim 7, wherein the forming of the functional layer comprises forming the functional layer to a thickness of about 500 Å to about 5000 Å.

9. The display device manufacturing method of claim 3, wherein, in the separating of the display panel, a minor axis of the laser has a width of about 370 μm to about 400 μm and a steepness of about 30 μm to about 60 μm.

10. The display device manufacturing method of claim 3, wherein, in the separating of the display panel, the laser has a wavelength of about 300 nm to about 400 nm.

11. The display device manufacturing method of claim 3, wherein, in the separating of the display panel, the laser is emitted in a direction from the processing substrate toward the display panel.

12. The display device manufacturing method of claim 3, further comprising forming, on the processing substrate, a sacrificial layer comprising amorphous silicon, wherein the forming of the display panel comprises forming the display panel on the sacrificial layer.

13. The display device manufacturing method of claim 3, wherein the forming of the display panel further comprises forming a circuit layer on the base layer, forming a light-emitting element layer on the circuit layer, and forming an encapsulation layer on the light-emitting element layer.

14. A display device manufacturing method comprising:

forming a display panel on a processing substrate by forming a first colorless polyimide layer on the processing substrate, forming a first barrier layer on the first colorless polyimide layer, forming a second colorless polyimide layer on the first barrier layer, forming, on the second colorless polyimide layer, a functional layer comprising a silicon oxide, and forming a second barrier layer on the functional layer; and separating the display panel from the processing substrate by emitting laser, wherein the forming of the first colorless polyimide layer or the forming of the second colorless polyimide layer comprises applying a colorless polyimide material, curing the colorless polyimide material at a curing temperature that is higher than about 430° C. and that is lower than or equal to about 470° C. for about 10 minutes to about 30 minutes, and cooling the colorless polyimide material with outside air.

15. The display device manufacturing method of claim 14, wherein the curing further comprises raising a temperature from about 180° C. to the curing temperature for about 4 minutes to about 6 minutes.

16. The display device manufacturing method of claim 14, wherein, in the separating of the display panel, the laser has an intensity such that about 90% of a maximum intensity is about 6.0 $MW/cm^2$ to about 6.8 $MW/cm^2$.

17. The display device manufacturing method of claim 14, wherein the separating of the display panel comprises emitting a laser beam having a wavelength of about 300 nm to about 400 nm.

18. The display device manufacturing method of claim 14, wherein the forming of the functional layer comprises forming the functional layer to a thickness of about 500 Å to about 5000 Å.

* * * * *